(12) United States Patent
Tamura et al.

(10) Patent No.: US 7,791,272 B2
(45) Date of Patent: Sep. 7, 2010

(54) LIGHT-EMITTING DEVICE COMPRISING PROTECTIVE LAYER WITH IRREGULAR SURFACE

(75) Inventors: Tomoyuki Tamura, Yokohama (JP); Ichiro Kataoka, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/613,448

(22) Filed: Dec. 20, 2006

(65) Prior Publication Data

US 2007/0145889 A1 Jun. 28, 2007

(30) Foreign Application Priority Data

Dec. 22, 2005 (JP) ............... 2005-370093

(51) Int. Cl.
- *H01L 51/56* (2006.01)
- *H01L 51/54* (2006.01)
- *H01L 51/52* (2006.01)
- *H01L 51/50* (2006.01)
- *C23C 16/40* (2006.01)
- *B05D 5/00* (2006.01)

(52) U.S. Cl. ............ 313/509; 313/504; 313/506; 313/512; 427/257; 427/255.37; 427/255.394; 427/255.29; 427/167; 427/256

(58) Field of Classification Search ......... 313/498–512; 427/124, 126.2, 294–295, 109, 167, 225.18, 427/255.19, 255.28, 255.29, 255.37, 255.394, 427/257, 256

See application file for complete search history.

(56) References Cited

U.S. PATENT DOCUMENTS

| | | | | |
|---|---|---|---|---|
| 6,198,218 B1 * | 3/2001 | Kobashi et al. | ............ | 313/504 |
| 6,211,613 B1 * | 4/2001 | May | ............ | 313/504 |
| 7,192,659 B2 * | 3/2007 | Ricks et al. | ............ | 428/690 |
| 2004/0189167 A1 * | 9/2004 | Adachi et al. | ............ | 313/112 |
| 2004/0189196 A1 * | 9/2004 | Cok | ............ | 313/512 |
| 2004/0247949 A1 * | 12/2004 | Akedo et al. | ............ | 428/704 |
| 2005/0151896 A1 * | 7/2005 | Hara et al. | ............ | 349/96 |
| 2005/0179371 A1 * | 8/2005 | Broer et al. | ............ | 313/506 |
| 2005/0218803 A1 | 10/2005 | Takeuchi et al. | ............ | 313/512 |
| 2006/0049745 A1 * | 3/2006 | Handa et al. | ............ | 313/503 |
| 2006/0066228 A1 * | 3/2006 | Antoniadis et al. | ............ | 313/506 |
| 2007/0001588 A1 * | 1/2007 | Boroson et al. | ............ | 313/504 |

FOREIGN PATENT DOCUMENTS

| | | |
|---|---|---|
| CN | 1678151 A | 10/2005 |
| JP | 2002-075659 | 3/2002 |
| JP | 2003-234179 | 8/2003 |
| JP | 2004-327195 | 11/2004 |

OTHER PUBLICATIONS

Chinese Office Action dated Oct. 10, 2008.
Patent Abstracts of Japan for JP 2004-327195, Nov. 18, 2004.
Machine translation of JP 2004-327195A.
Official Action of Aug. 7, 2009 in Chinese Appln. No. 2006-10171121.8.
Translation of Korean Office Action dated Oct. 31, 2007.

* cited by examiner

*Primary Examiner*—Sikha Roy
*Assistant Examiner*—Jose M Diaz
(74) *Attorney, Agent, or Firm*—Fitzpatrick, Cella, Harper & Scinto

(57) ABSTRACT

A light-emitting element includes a protective layer in contact with an upper electrode and a circular polarizer in contact with the protective layer.

11 Claims, 1 Drawing Sheet

LIGHT-EMITTING DEVICE COMPRISING PROTECTIVE LAYER WITH IRREGULAR SURFACE

BACKGROUND OF THE INVENTION

1. Field of the Invention

The present invention relates to a light-emitting device such as an organic electroluminescence device (referred to as "organic EL device" hereinafter).

2. Description of the Related Art

Development of light-emitting device displays is being actively pursued. Japanese Patent Laid-Open No. 2003-234179 (JP '179) discloses an invention related to an organic EL device display (OLED display).

FIG. 1 shows an OLED display described in JP '179. The OLED display includes an optically transparent substrate 1, a first electrode 2, an organic film 6, a second electrode 9, a diamond-like carbon film (DLC film) 10, a protective film 12, a first protective film 13, a second protective film 15, and an optical compensation film 18. FIG. 1 corresponds to the third embodiment in JP '179.

According to JP '179, "DLC film" means a diamond-like carbon film.

In FIG. 1, the DLC film is the layer that lies between the layer indicated by reference numerals 15 and 18 and the layer indicated by reference numerals 13 and 17. The DLC film has substantially the same shape as that of the layer indicated by reference numerals 13 and 17. It should be noted here that reference numeral 10 and the lead line therefor are omitted from the drawing.

Paragraph [0013] of JP '179 discloses optical compensation film 18 as being transparent and having an antireflection function, a lens-collimation function, etc., and further that optical compensation film 18 is laminated on second protective film 15.

Paragraph [0011] of JP '179 describes use of a transparent acrylic resin 17 as the first protective film 13. In other words, the first protective film 13 is composed of a transparent acrylic resin.

As indicated by dashed arrows in the drawing, light is extracted toward the upper side of the OLED display.

Although the document discloses the antireflection function of optical compensation film 18, no specific description thereof is provided. Persons skilled in this art will interpret the phrase "antireflection function" to mean the function of preventing the reflection of ambient light at the optical compensation film.

However, the present inventors have made the following discovery during the development of organic EL devices with regard to reflection of ambient light.

When an organic EL device is used in a display surface, the visibility of the display surface decreases by the influence of ambient light. This is because ambient light that enters the device is reflected at an electrode remote from the observer and is emitted back to the exterior of the device.

In other words, the present inventors have found that in order to improve visibility of the display surface, it is more important to prevent ambient light that enters the device from being reflected back to the exterior of the device than to prevent reflection of ambient light at the outer surface of the device.

However, JP '179 provides no means for preventing ambient light entering the device from being reflected back to the exterior of the device. If the device disclosed in JP '179 is to completely prevent ambient light from entering the device, then optical compensation film 18 must be an optically opaque member. However, if the film is optically opaque, it is substantially impossible to extract the light emitted by the device itself.

SUMMARY OF THE INVENTION

The present invention provides a light-emitting device in which ambient light which enters the device and is reflected therein is prevented from being extracted to the exterior of the device.

According to the present invention, a light-emitting device includes a lower electrode, a light-emitting layer, an upper electrode, a protective layer in contact with the upper electrode, and a circular polarizer in contact with the protective layer.

In the light-emitting device of the present invention, since the circular polarizer is in contact with the protective layer, the number of interfaces between the circular polarizer and the protective layer is at a minimum. Thus, a thin light-emitting element that can prevent ambient light entering the device from being reflected back to the exterior of the element can be provided.

Further features of the present invention will become apparent from the following description of exemplary embodiments with reference to the attached drawings.

DESCRIPTION OF THE PREFERRED EMBODIMENTS

First Embodiment

A light-emitting device of the invention includes a lower electrode, a light-emitting layer, an upper electrode, a protective layer in contact with the upper electrode, and a circular polarizer in contact with the protective layer.

In other words, the circular polarizer is formed to directly contact the protective layer, and no gap layer or atmospheric layer such as air, gas, or vacuum is present in the device from the circular polarizer to the lower electrode. Since this feature prevents generation of a large refractive index difference within the device, a thin light-emitting device that can prevent ambient light from being emitted from the device is provided.

The circular polarizer is disposed on the protective layer preferably by using an adhesive so that any irregularities in the protective layer are filled with the adhesive. The thickness of the adhesive preferably corresponds to the depth of the irregularities in the protective layer of the organic light-emitting device. For example, an adhesive thickness of 1 μm or more is preferably employed.

The upper electrode is preferably a light-extracting-side electrode.

The protective layer preferably includes at least silicon and nitrogen to prevent permeation of moisture. The protective layer may be composed of silicon oxynitride.

An additional protective member is preferably provided at the light-extracting-side of the circular polarizer. In this manner, the device can be protected from external forces.

The light-emitting layer may be a single layer or a laminate including a first sublayer and a second sublayer so that light can be emitted from the interface of the sublayers.

The light-emitting layer is preferably an organic compound layer. Note that the light-emitting device of the present invention can also be applied to an inorganic EL device having a light-emitting layer composed of an inorganic compound.

The light-emitting device of the present invention is preferably used in the display portion of a display.

The light-emitting device of the present invention is preferably used in an image pickup apparatus having an image pickup unit. Examples of the image pickup apparatus include digital still cameras and digital video cameras.

The light-emitting device of the present invention may also be used in the display portion of a cellular phone or a lighting apparatus, for example.

Second Embodiment

A light-emitting device according to a first embodiment of the present invention includes a circular polarizer in contact with a protective layer.

Figure 1:
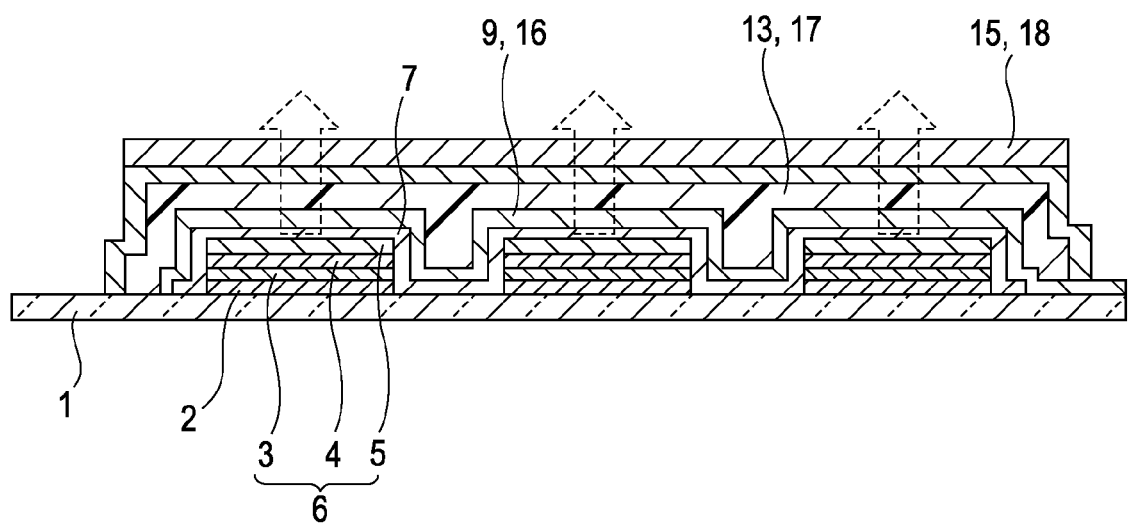
FIG. 1 is a schematic cross-sectional view of a Prior Art organic EL device.
Figure 2:
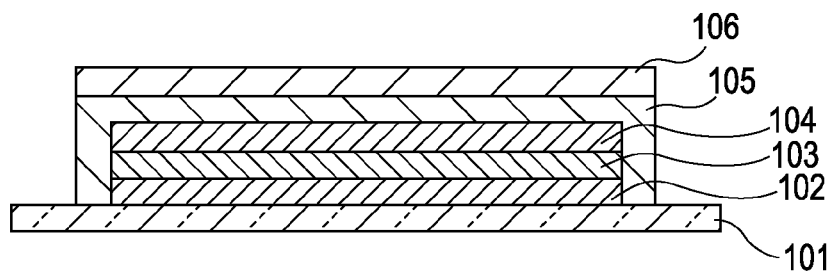
FIG. 2 is a schematic cross-sectional view of a light-emitting device according to a first embodiment.

FIG. 2 is a schematic cross-sectional view for explaining the light-emitting device of the first embodiment. Light is extracted in an upward direction.

The light-emitting device includes a lower electrode 102, a light-emitting layer 103, an upper electrode 104, a protective layer 105, and a circular polarizer 106 sequentially formed on a substrate 101.

The substrate 101 may be flexible or rigid. An example thereof is a glass substrate. The substrate may be provided with a switching element (not shown) for controlling emission/non-emission. The switching element is, for example, a transistor such as a TFT. When a switching element is provided, the light-emitting device may be disposed on the switching element. In such a case, a planarizing film may be provided between the switching element and the light-emitting device.

The lower electrode 102 may be a reflecting electrode or a transparent electrode. When the lower electrode 102 is a transparent electrode, an additional reflecting member may be provided. The lower electrode may be composed of silver or aluminum or may be an electrode including at least one of silver and aluminum. Alternatively, indium tin oxide (ITO) or indium zinc oxide (IZO) may be used in the lower electrode.

The light-emitting layer 103 may be a single layer or may include two sublayers so that light is emitted from the interface of the two sublayers.

Although not shown in the drawing, a layer other than a conventional light-emitting layer may be additionally provided between the lower electrode 102 and the upper electrode 104. This additional layer can be provided to improve the emission efficiency and may be, for example, a hole injection layer, a hole transport layer, an electron blocking layer, a hole blocking layer, an electron transport layer, or an electron injection layer. These layers may be provided as necessary. If one of these additional layers emits light, that layer can be regarded as a constituent of the light-emitting layer of the present invention.

When the light-emitting device of this embodiment is used as an organic EL device, the light-emitting layer may at least include a host and a guest. Furthermore, the light-emitting layer may be phosphorescent or fluorescent.

In this invention, the lower electrode, the light-emitting layer, and the upper electrode are not necessarily in contact with one another.

For example, any of the above-described additional layers may be provided between the lower electrode and the light-emitting layer or between the light-emitting layer and the upper electrode to increase the light-emitting efficiency. Alternatively, a transparent member or a semi-transparent film may be additionally provided to enhance intensification of light by interference.

The upper electrode 104 is preferably a light-extracting-side electrode. ITO or IZO can be used as the upper electrode 104. In this manner, the light-emitting device can use the upper electrode as the light-extracting-side electrode.

Both the upper electrode and the lower electrode may disposed at the light-extracting-side.

In this embodiment, the light-extracting-side electrode may be a transparent electrode having a high light transmittance (at least 80%) or a half-mirror electrode. When the light-extracting-side electrode is a half-mirror electrode, a thin film of aluminum or the like may be used in the electrode.

The protective layer 105 is directly disposed on the upper electrode 104 and is preferably composed of a compound such as silicon nitride that can protect the device from moisture. The protective layer may include oxygen, and may thus be composed of silicon oxynitride. The protective layer more preferably has a two-layer structure including a silicon oxynitride sublayer and a silicon nitride sublayer arranged in that order from the upper-electrode-side. According to this arrangement, the silicon oxynitride of the former sublayer satisfactorily adheres onto the upper electrode or satisfactory covers the upper electrode, and the device can be protected from moisture due to a high moisture-proof effect of silicon nitride in the latter layer. The protective layer can be obtained by, for example, a vacuum deposition method such as sputtering or chemical vapor deposition (CVD).

The moisture permeability of the protective layer is preferably 0.01 g $H_2O$/day or less (measurement method: Japanese Industrial Standard (JIS) K7126 (MOCON method).

The light transmittance of the protective layer is preferably 80% or more.

The circular polarizer 106 is directly disposed on the protective layer 105. The circular polarizer includes, for example, a polarizing member (e.g., linear polarizing member) and a retarder member (e.g., $\lambda/4$ phase shifting member).

The circular polarizer may be disposed on the protective layer by using a roll laminator.

Ambient light is prevented from being reflected out of the device by the circular polarizer as described below. First, ambient light entering the device is circularly polarized by the circular polarizer. The circularly polarized light is then reflected inside the device to give inverted circularly polarized light. The inverted circularly polarized light cannot be reflected out of the device since it is blocked by the circular polarizer. Thus, ambient light that enters the device is trapped within the device due to the circular polarizer, and the light-emitting device can provide high visibility.

In the light-emitting device of the present invention, the protective layer is in contact with the upper electrode, and the circular polarizer is in contact with the protective layer.

This means that the light-emitting device not merely contains a circular polarizer but it directly incorporates the circular polarizer as a constituent integrated therewith. As a result, the thickness of the device can be reduced, and the number of interfaces (which causes a refractive index difference) of the laminate from the protective layer to the circular polarizer can be minimized. Thus, reflection of ambient light can be efficiently prevented.

The meaning of the phrase "light-emitting device directly incorporates the circular polarizer" is that the light-emitting device has a structure in which the circular polarizer is integral with the light-emitting device and is not separated from the constituents of the light-emitting device.

The phrase "structure in which the circular polarizer is not separated from the constituents of the light-emitting device" means a structure in which a predetermined space (e.g., space under vacuum, space filled with air or inert gas such as nitrogen, or space filled with a liquid or a gel fluid) is not disposed between the circular polarizer and the light-emitting device.

The phrase "predetermined space" means a space formed between the circular polarizer and other constituent layers of the light-emitting device during use. For example, if a light-emitting device is disposed inside a sealing cap and a circular polarizer is provided on the sealing cap, the phase "predetermined space" refers to a space that exists between the device inside the sealing cap and the circular polarizer. Another example of a predetermined space is a space filled with a sealing resin when a light-emitting device is disposed opposite to a cover glass, which is a plate-shaped component, with the sealing resin therebetween. In this case, a polarizer is disposed on the cover glass. However, a thin adhesive bonding the polarizer to the protective layer does not qualify as a predetermined space.

The present inventors have departed from the prevailing idea of providing a circular polarizer on a sealing cap surface or a cover glass surface and have succeeded in preventing reflection of ambient light by directly disposing the circular polarizer on the protective layer so that the number of interfaces in the laminate including the upper electrode to the circular polarizer can be minimized.

The light-emitting device not only prevents reflection of ambient light, but also provides thickness reduction since the thickness of the sealing cap, cover glass, or above-described space is excluded from the thickness of the light-emitting device.

This advantageously expands the fields of application of the light-emitting device as compared to light-emitting devices that prevent reflection of ambient light by providing a circular polarizer on a sealing cap or cover glass.

In the light-emitting device of this embodiment, the circular polarizer is disposed on the protective layer with an adhesive therebetween. In this manner, the circular polarizer can be easily bonded onto the protective layer. The adhesive preferably has a high light transmittance. An acrylic adhesive or a silicon-based adhesive may be used as the adhesive.

In the light-emitting device of this embodiment, the thickness of the adhesive is sufficiently small such that the circular polarizer can still be regarded as being integral with the protective layer. In particular, the thickness of the adhesive is 5 μm to 100 μm, which is the thickness range that does not cause cohesive failure.

In the light-emitting device of this embodiment, an additional protective plate may be disposed, for example, above the circular polarizer of the light-emitting device to protect the light-emitting device from external force, such as the touch of a user.

EXAMPLES

Example 1

An organic EL device having a cross-sectional structure shown in FIG. 2 was made as follows.

First, a TFT circuit and a lower electrode 102 were disposed on a glass substrate having a thickness of 0.7 mm. A light-emitting layer 103, which was a laminated organic EL layer including a hole transport sublayer composed of α-NPD, a light-emitting sublayer composed of Alq3, and a metal-doped sublayer composed of Alq3 doped with an alkali metal, was deposited on the lower electrode 102 by a vapor deposition process. An upper electrode 104 was formed on the layer 103 by sputtering.

Next, a protective layer 105 composed of SiN was deposited by a CVD process. In the CVD process, a mixed gas containing $NH_3$, $SiH_4$, and $N_2$ was introduced as a material gas into a deposition chamber, and deposition was conducted at a pressure of 100 Pa and a RF power of 100 W. The deposition was terminated when the thickness reached 5,000 Å.

A circularly polarizing plate 25 μm in thickness with an acrylic adhesive (a thermosetting pressure-sensitive adhesive produced by Soken Chemical Engineering Co., Ltd.) provided thereon was cut to obtain a circular polarizer about 0.5 mm larger in size than the region for the light-emitting device. The circular polarizer was aligned and bonded with the protective layer 105 by using a bonding machine produced by Yodogawa Medec Co., Ltd.

The bonding was conducted at a rate of 50 mm/sec and a pressure of 0.2 MPa.

Through the above-described steps, an organic EL device having a protective layer in contact with a circular polarizer above an organic EL device portion was provided.

Example 2

A glass substrate was disposed on the circular polarizer of the organic EL device made in EXAMPLE 1 with an adhesive layer therebetween.

A glass substrate (#1737 (trade name) produced by Corning Incorporated) having a thickness of 0.3 mm and substantially the same size as that of the circular polarizer was prepared as a protective substrate for the organic EL device of EXAMPLE 1.

An acrylic pressure-sensitive adhesive (SK-1831 (trade name) produced by Soken Chemical & Engineering Co., Ltd.) was applied as the adhesive to a thickness of 25 μm onto the protective substrate so as to bond the protective substrate with the pressure-sensitive adhesive using a bonding machine (SH-MINI (trade name) produced by Ishiihyoki Corporation). The pressure for the bonding was 0.2 MPa.

Next, the protective substrate with the adhesive was bonded with the organic EL device of EXAMPLE 1 using a parallel-plate press machine under a vacuum of 10 Pa at a bonding temperature of room temperature and a pressure of 0.3 MPa to prepare an organic EL device panel.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-370093 filed Dec. 22, 2005, which is hereby incorporated by reference herein in its entirety.

What is claimed is:

1. A light-emitting device comprising:
a lower electrode;
a light-emitting layer;
an upper electrode at a light-extracting side;
a transparent protective layer disposed at the light-extracting side on the upper electrode, wherein the transparent protective layer is formed by vacuum depositing, wherein the surface of the transparent protective layer has irregularities;

a substrate supporting (a) a laminate of, in order, the lower electrode, the light-emitting layer and the upper electrode and (b) the transparent protective layer;

a circular polarizer bonded to the transparent protective layer with an adhesive, and wherein the irregularities in the surface of the transparent protective layer are filled with the adhesive in a layer thickness of at least one micron.

2. The light-emitting device according to claim 1, further comprising a protective member at a light-extracting-side of the circular polarizer.

3. The light-emitting device according to claim 1, wherein the light-emitting layer is a single layer.

4. The light-emitting device according to claim 1, wherein the light-emitting layer is a laminate that includes a first sublayer and a second sublayer and light is emitted from the interface between the first sublayer and the second sublayer.

5. The light-emitting device according to claim 1, wherein the light-emitting layer is an organic compound layer.

6. A display comprising a display portion including the light-emitting device according to claim 1.

7. An image pickup apparatus comprising the light-emitting device according to claim 1 and an image pickup unit.

8. A light-emitting device according to claim 1, further comprising a switching element disposed under said lower electrode.

9. The light-emitting device according to claim 1, wherein the transparent protective layer includes silicon and nitrogen.

10. The light-emitting device according to claim 1, wherein the transparent protective layer contacts the substrate at an outer periphery of a region where the light-emitting layer is disposed.

11. The light-emitting device according to claim 1, wherein the thickness of the adhesive is 5 μm to 100 μm.

* * * * *